United States Patent
Hebenstreit et al.

(10) Patent No.: US 8,648,772 B2
(45) Date of Patent: Feb. 11, 2014

(54) AMALGAMATED DISPLAY COMPRISING DISSIMILAR DISPLAY DEVICES

(75) Inventors: Joseph J. Hebenstreit, San Francisco, CA (US); Amish Rajesh Babu, Sunnyvale, CA (US)

(73) Assignee: Amazon Technologies, Inc., Reno, NV (US)

( * ) Notice: Subject to any disclaimer, the term of this patent is extended or adjusted under 35 U.S.C. 154(b) by 894 days.

(21) Appl. No.: 12/544,968

(22) Filed: Aug. 20, 2009

(65) Prior Publication Data

US 2011/0043435 A1 Feb. 24, 2011

(51) Int. Cl.
*G09G 5/00* (2006.01)

(52) U.S. Cl.
USPC ............................................................ 345/5

(58) Field of Classification Search
None
See application file for complete search history.

(56) References Cited

U.S. PATENT DOCUMENTS

| | | | |
|---|---|---|---|
| 4,371,870 A * | 2/1983 | Biferno ............................. | 345/4 |
| 6,445,489 B1 | 9/2002 | Jacobson et al. | |
| 6,621,541 B1 | 9/2003 | Choi | |
| 6,704,133 B2 | 3/2004 | Gates et al. | |
| 6,753,999 B2 | 6/2004 | Zehner et al. | |
| 7,170,506 B2 | 1/2007 | Eldon et al. | |
| 7,205,959 B2 * | 4/2007 | Henriksson ....................... | 345/4 |
| 7,619,585 B2 * | 11/2009 | Bell et al. ........................ | 345/9 |
| 7,626,594 B1 * | 12/2009 | Witehira et al. ............. | 345/619 |
| 7,697,840 B2 * | 4/2010 | Kurosawa ..................... | 396/384 |
| 7,730,413 B1 * | 6/2010 | Engel et al. .................... | 715/764 |
| 7,782,382 B2 * | 8/2010 | Fujimura ....................... | 348/302 |
| 8,063,887 B2 * | 11/2011 | Barrus et al. .................. | 345/173 |
| 8,106,852 B2 * | 1/2012 | Fujinawa et al. ................ | 345/4 |
| 8,146,277 B2 * | 4/2012 | Engel ............................. | 40/453 |
| 8,179,338 B2 * | 5/2012 | Engel et al. ...................... | 345/4 |
| 8,264,645 B2 | 9/2012 | Jepsen | |
| 8,264,646 B2 | 9/2012 | Jepsen | |
| 2004/0239582 A1 * | 12/2004 | Seymour ......................... | 345/5 |
| 2005/0206582 A1 * | 9/2005 | Bell et al. ........................ | 345/6 |
| 2005/0219149 A1 * | 10/2005 | Tuyls et al. ..................... | 345/4 |
| 2008/0007486 A1 * | 1/2008 | Fujinawa et al. ................ | 345/5 |
| 2008/0192013 A1 * | 8/2008 | Barrus et al. .................. | 345/173 |
| 2008/0211734 A1 * | 9/2008 | Huitema et al. ............. | 345/3.1 |
| 2011/0043435 A1 * | 2/2011 | Hebenstreit et al. ............ | 345/5 |

OTHER PUBLICATIONS

Timmer, John, Scientists make bendable, trasparent LEDs-without organics, Aug. 20, 2009, printed from : http://arstechnica.com/science/news/2009/08/researchers-build-bendy-displays-with-inorganic-leds.ars, 1 page.

PCT Search Report for PCT Application No. PCT/US2010/046018, mailed Dec. 27, 2010 (11 pages).

* cited by examiner

*Primary Examiner* — Peter Vincent Agustin

(74) *Attorney, Agent, or Firm* — Lee & Hayes, PLLC

(57) ABSTRACT

A reflective display, such as an electrophoretic display (EPD), and an emissive display, such as a backlit liquid crystal display, may be combined to form an amalgamated display. This combination may include layering one display atop the other, alternating reflective and emissive display elements, or otherwise interspersing reflective and emissive display elements with one another. Images on the amalgamated display may be presented using either reflective or emissive modes or a combination of the two, depending upon factors such as refresh rate, power consumption, presence of color and/or video, and so forth.

29 Claims, 9 Drawing Sheets

AMALGAMATED DISPLAY COMPRISING DISSIMILAR DISPLAY DEVICES

BACKGROUND

Electronic displays are found in electronic devices such as electronic book readers ("e-book readers"), cellular telephones, personal digital assistants (PDAs), portable media players, tablet computers, netbooks, desktop computers, televisions, and so on. The electronic displays of these devices present information, operational status, and content items such as books and movies to viewers.

Conventional electronic displays are either emissive or reflective. Some reflective displays, such as electrophoretic displays (EPDs), provide a visual experience similar to "ink-on-paper." These are termed "reflective" because they operate predominately by changing their reflectance to light falling on their surface. Reflective displays typically require very little or no power after formation of an image, making them useful in mobile applications, such as e-book readers and the like, where battery power is limited. Reflective displays also provide good visibility in bright conditions, such as sunlight. Unfortunately, reflective displays typically have slow refresh rates, require special front or side-lighting to remain usable in dark conditions and, in some instances, do not render color.

In contrast to reflective displays, emissive displays produce their own light. Emissive displays may enable faster refresh rates and color output, although emissive displays may washout and become less visible in bright light such as sunlight.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Reflective displays, such as electrophoretic displays (EPDs), and emissive displays, such as organic light emitting diode (OLED) displays, may be combined to form an amalgamated display. This combination may include layering one display atop the other so elements of each display are approximately collinear, alternating reflective and emissive display elements, or otherwise interspersing reflective and emissive display elements between one another. Images on the amalgamated display may be presented using either reflective or emissive modes or a combination of the two, depending upon factors such as refresh rate, power consumption, presence of color, presence of video, and so forth.

For example, a portable electronic device such as an e-book may use a reflective display to provide a reflective mode to render text. This reflective mode provides a viewer with a visual experience similar to "ink-on-paper," while also using minimal power and thus helping to extend battery life of the device. When a user wishes to view content such as a color picture, full motion video clip, or other content, meanwhile, all or a portion of the display may be transitioned to an emissive mode, provided by an emissive display. The emissive display then renders the content, such as the picture or full motion video clip.

Illustrative Environment

Figure 1:
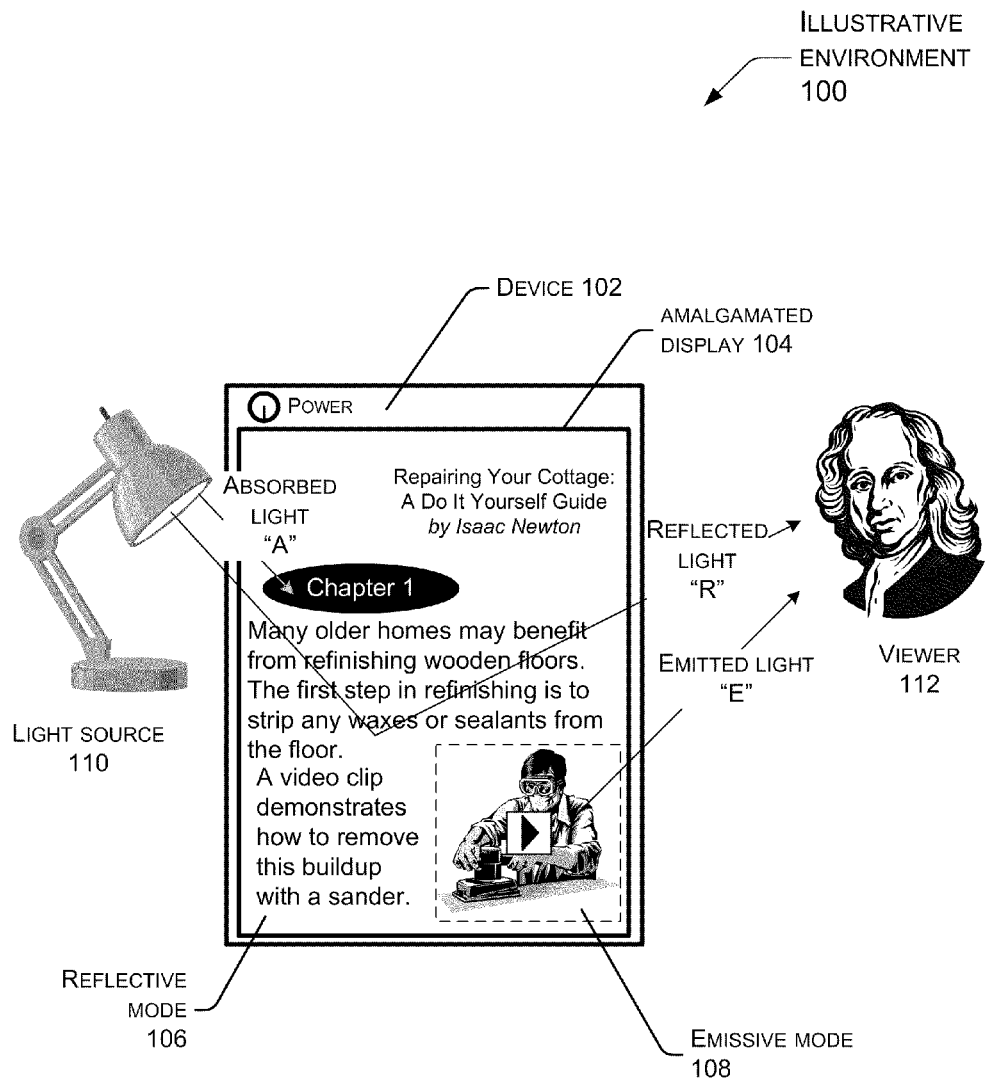
FIG. 1 represents an example environment for use of an amalgamated display.

FIG. 1 represents an illustrative environment 100 for use of an amalgamated display comprised of dissimilar display devices. In environment 100, a device 102 such as an e-book reader, portable media player, laptop, desktop computer display, or the like has an amalgamated display 104 which produces an image. This image may reproduce textual information, pictures, video, and/or any other content that can be visually rendered and consumed. The amalgamated display 104, or portions of the display, may operate in a reflective mode 106, an emissive mode 108 or, in some instances, in both modes at the same time. While in the reflective mode 106, elements of the display may present at least two states: a non-reflective state and a reflective state. In the reflective state, light emitted from a light source 110, such as a table lamp or any other light (e.g., sunlight), may be absorbed ("A") by a reflective display element in a pass-through or dark state to render a dark or black spot. Conversely, light from the light source 110 may be reflected ("R") off of the surface substantially towards the viewer 112 when a reflective display element is in a reflective state.

In addition, all or a portion of the amalgamated display 104 may be operated in the emissive mode 108. In the emissive mode 108, pixel elements generate their own light ("E") which originates from the display 104 and is directed substantially towards the viewer. A pixel element (or "pixel") may include an element which emits photons such as a light emitting diode, combination of liquid crystal and backlight, and so forth. For example, an emissive display may provide a light emitting diode, which comprises a circuit element that emits photons when passing an electric current. In general, emissive technologies utilize electrical energy to produce photons.

As described below, portions of or the entire display may transition between the reflective mode 106 and the emissive mode 108 while viewer 112 operates device 102 to consume content. For instance, suppose the viewer 112 is viewing an e-book about home repair by Isaac Newton on the amalgamated display 104. In this example, device 102 may employ the reflective mode 106 while displaying the text on the display, as this provides a strong visual similarity to the "ink-on-paper" experience while consuming minimal power. As part of the e-book in this example, the viewer 112 sees a prompt for a video clip which demonstrates how to refinish a wooden floor. The prompt for the video clip may initially be provided through utilization of the reflective mode 106. Upon selection of the prompt to view the video clip, device 102 may transition a portion of the amalgamated display 104 (indicated in this illustration by broken lines) from the reflective mode 106 to the emissive mode 108. The device 102 then presents the video clip using the emissive mode 108, which may allow for presentation of full motion video and color. Upon completion of the video clip, the portion of the amalgamated display 104 may revert to the reflective mode 106. In an alternative implementation, the prompt for the video clip may be initially provided using the emissive mode 108 to provide better visualization or color for the represented video clip.

The size and location of the portion of the amalgamated display 104 that may be in the reflective mode 106 or the emissive mode 108 may vary. For example, when the viewer 112 selects a full screen presentation of the video clip, the amalgamated display 104 may be predominately or entirely in the emissive mode 108 with only a small or no portion in the reflective mode 106. In other instances, a portion of the display 104 may render content in the emissive mode 108 while rendering additional content in the reflective mode 106. For instance, the viewer 112 can read an article comprising text that also includes simultaneous display of a color image or video. Here, the display 104 may render the text with use of the reflective mode 106 while simultaneously rendering the color image or video with the emissive mode 108, as FIG. 1 illustrates and as discussed above.

Illustrative Construction and Operation

Figure 2A:
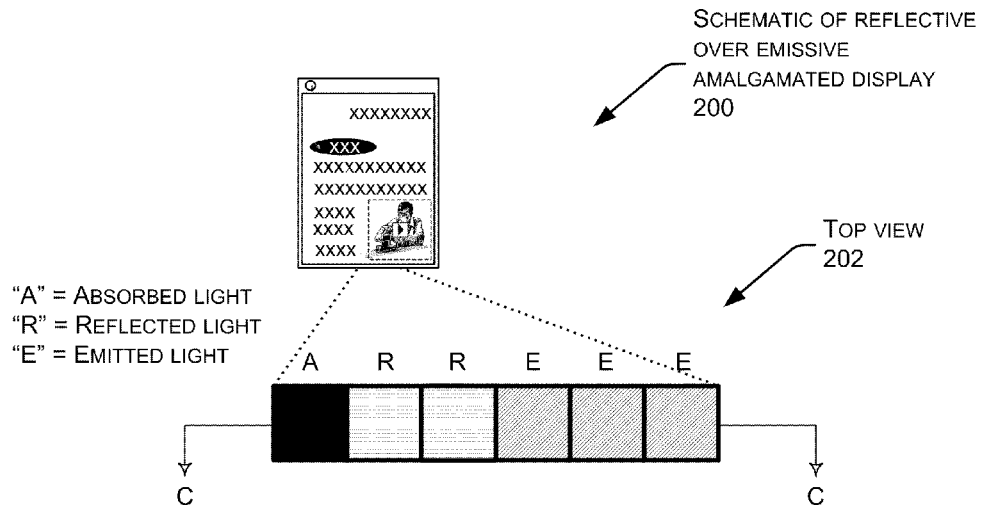
FIGS. 2A and 2B are schematics illustrating an example amalgamated display comprising a reflective display over an emissive display.

FIGS. 2A and B are schematics 200 illustrating an example amalgamated display comprising a reflective display over an emissive display. In this and the following figures, the display elements ("elements") used to generate pixels are shown as being approximately the same size with one another. However, in some implementations these display elements may vary in size between display type, or within the same type of display. For example, a reflective display element may be larger than an emissive display element, or vice versa.

FIG. 2A shows a top view 202 of a row of six elements from the perspective of the viewer 112 looking straight down at the display. From left to right, the elements are configured to Absorb, Reflect, Reflect, Emit, Emit, and Emit light. A cross section of these six elements along line "C" is shown at 204 in FIG. 2B.

Figure 2B:
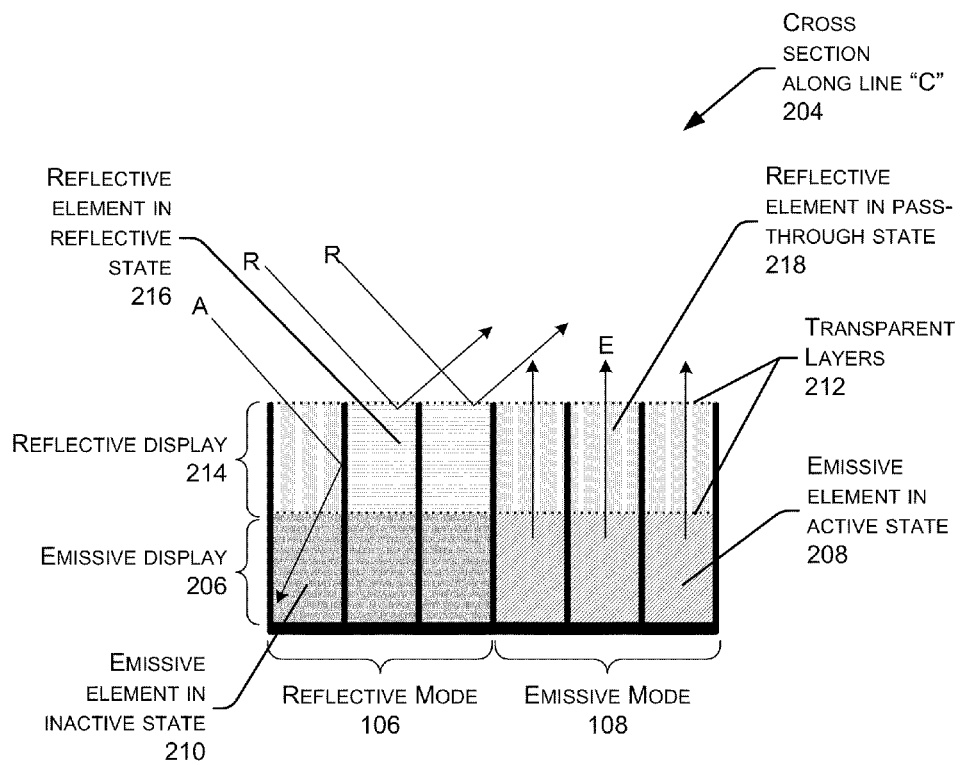

Cross section 204 in FIG. 2B illustrates that the amalgamated display comprises a combination of dissimilar display types. In this example, cross-section 204 depicts that the amalgamated display includes an emissive display 206 layer comprising emissive display elements. The emissive display 206 generates an image by producing light and emitting that light upwards towards the viewer 112. Example emissive displays include, but are not limited to, light emitting diodes (LED) displays, organic LEDs displays, backlit liquid crystal displays (LCD), plasma displays, microelectromechanical system (MEMS) displays, electroluminescent displays, quantum dot displays, field emission displays, and so forth.

At a given moment, elements of the emissive display 206 may reside in either an active or inactive state. Emissive elements residing in an active state 208 emit light, while emissive elements residing in an inactive state 210 do not. In FIGS. 2A and 2B as well as the figures that follow, an angled crosshatch indicates emissive elements in the active state 208 while shading indicates emissive elements in the inactive state 210.

Arrows labeled "E" and originating in the emissive elements indicate emission of light by an emissive element in an active state. Emitted light "E" from the emissive display 206 may pass through a transparent layer 212 and through an element of a reflective display 214 configured to allow the emitted light to pass-through the respective element for consumption by the viewer 112. In some implementations, the layer 212 may be translucent. Transparent layer 212 may comprise a portion of the circuitry of the emissive display 206, the reflective display 214, or both. The passing through of emitted light through a reflective element is described in more detail below.

As illustrated, the reflective display 214 comprises reflective display elements. The reflective display generates an image by reflecting incident light from another source 110, such as a lamp, sunlight, and so forth. Example reflective displays include, but are not limited to, electrophoretic displays (EPD), cholesteric liquid crystal displays, microelectromechanical system (MEMS) displays, electrowetting displays, electrofluidic displays, and so forth.

The reflective display 214 may configure its elements to operate in a reflective state or a non-reflective pass-through state. For simplicity of discussion and not by way of limitation, the reflective display 214 is discussed as having only reflective and pass-through states. In some implementations, additional non-reflective and/or non-pass through states may be used, such as those used to create a pixel having a value between white and black.

The reflective display 214 may configure one or more elements to operate in a reflective state 216. In the reflective state, incident light "R" reflects from the reflective display element generally towards the viewer, and appears to be a white (non-dark) or lighter-appearing pixel, as indicated in top view 202.

When an amalgamated display is configured as shown in FIG. 2B with the reflective display 214 over the emissive display 206, light from the emissive display 206 may be prevented from passing through the reflective display 214 to the viewer 112 while the device is in the reflective state 216. As such, the device may display the content that the reflective display renders rather than any content that the emissive display renders.

In addition, the reflective display 214 may configure one or more reflective elements to operate in a pass-through state 218 such that light may pass through the respective reflective display element. For example and as FIGS. 2A and B illustrate, light "E" that the emissive display 206 emits from an element below the reflective display 214 may pass through the reflective display element in the pass-through state 218. Similarly, incident light "A" from light source 110 may pass through a reflective display element that is in a pass-through state to be absorbed by the reflective display element or the emissive display element below, which is in the inactive "dark" state 210. This absorption thus creates a dark pixel, as indicated in top view 202 at "A." In FIGS. 2A and 2B, as well as the figures that follow, vertical hatching indicates reflective elements in a pass-through state. In instances where all or a portion of the reflective display is in the pass-through state, the device may display content that the emissive display renders by emitting light through the empty space that the pass-through state provides.

In this schematic, the emissive display elements and reflective display elements are shown arranged in a collinear arrangement, stacked one atop the other. In other implementations, however, elements of the two displays may not be so aligned. For example, elements may be out of alignment such as when an emissive element is larger than a reflective element, or vice versa. In addition and as discussed below with reference to FIG. 5B, these display elements may reside in a single plane rather than stacked in multiple planes as illustrated in FIG. 2B and described above.

Returning to the example of FIG. 1, suppose that the video clip that the device 102 renders begins to play. Within the area of the amalgamated display 104 designated for emissive mode 108, the reflective display 214 elements are configured to enter the pass-through state 218. Elements of the emissive display 206 may be active 208 and emit light, which passes through the reflective display and produces the video image to viewer 112. Thus, the device 102 may render the majority of the content to the viewer 112 in the power efficient and easily readable reflective mode 106, while also rendering the video image using the emissive mode 108.

While the above example illustrates and describes an amalgamated display comprising two layers, other implementations may employ three or more layers of display devices. For example, an amalgamated display may comprise a reflective EPD display layered with an emissive transparent OLED display atop an emissive plasma display. Alternatively, other implementations may employ any other combination of any other number of display devices.

Figure 3A:
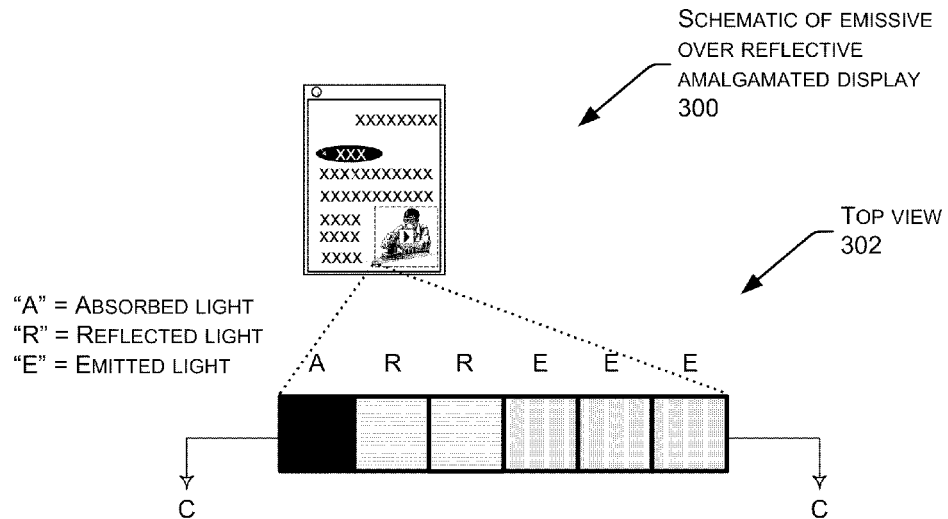
FIGS. 3A and 3B are schematics illustrating another example amalgamated display comprising a reflective display over an emissive display.
Figure 3B:
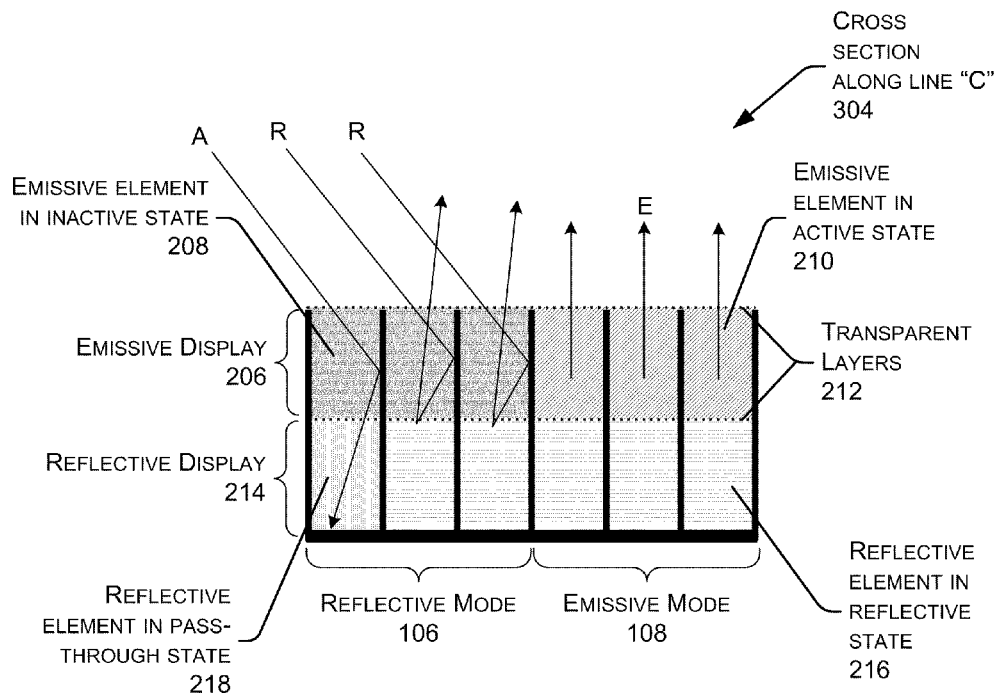

FIGS. 3A and 3B are schematics 300 illustrating an amalgamated display comprising an emissive display over a reflective display. In this implementation, the emissive display 214 comprises a transparent or translucent display (comprising transparent or translucent elements), which allows incident light to reach and be directed (as the element state dictates) by the reflective display 206 underneath. In some implementations, the emissive display 214 may comprise transparent or translucent portions as well as opaque portions. In such implementations, the opaque portions may be configured to minimize undesirable interference with incident or emitted light.

Generally, the image that the upper layer produces will be the sharpest, given the direct optical path to the eyes of the viewer 112. Images produces by the lower layer, meanwhile, may be slightly degraded somewhat due to the additional travel of light through the upper layer. In a stacked arrangement such as the arrangement that FIGS. 2B and 3B depict, selection of whether to place the emissive display 214 above or below the reflective display 206 may be determined by the anticipated primary usage of the display. For example, in instances where a device is primarily used to display text, the reflective display may be placed on the upper layer as depicted in FIG. 2B. Meanwhile, in instances where a device such as a portable media player is primarily used to display video that is better suited to an emissive display, the emissive display may be placed on the upper layer as shown here in FIG. 3B.

Figure 4:
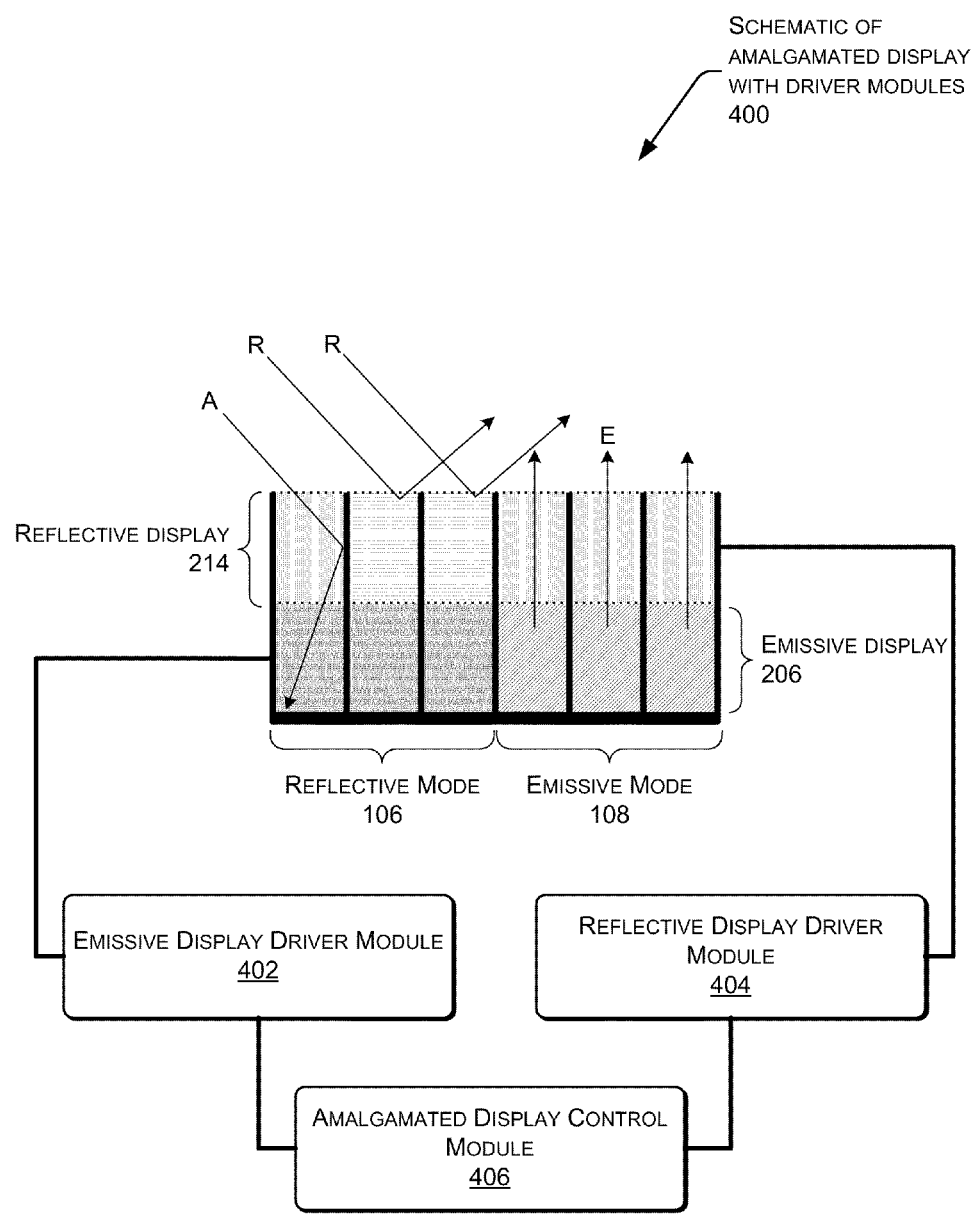
FIG. 4 is a schematic illustrating an example amalgamated display and a reflective display driver module, an emissive display driver module, and an amalgamated display control module.

FIG. 4 is a schematic 400 illustrating an amalgamated display and modules used to drive the dissimilar displays. An emissive display driver module 402 may operatively couple, such as by electrical conductors, to the emissive display 206. Emissive display driver module 402 is configured to manipulate the state of elements in the emissive display 214. For example, reflective display driver module 402 may change an emissive element from an inactive state to an active state to create a lit pixel and vice versa.

Next, a reflective display driver module 404 may operatively couple, such as by electrical conductors, to reflective display 214. Reflective display driver module 404 is configured to manipulate the state of elements in the reflective display 214. For example, the reflective display driver module 404 may change a reflective element from a pass-through state 218 to a reflective state 216, thus producing a light pixel when viewed with incident light from another source 110. In addition, the reflective display driver module 404 may change a reflective element from a reflective state 216 to a pass-through state 218.

The emissive display driver module 402 and the reflective display driver module 404 may couple to an amalgamated display control module 406, which may coordinate the operation of the two displays. For example, when configuring the portion of the amalgamated display 104 for the emissive mode 108 to display the video clip of FIG. 1, amalgamated display control module 406 may provide screen coordinates to the reflective display driver module 404 to set reflective elements to pass-through mode for the designated portion of the screen. In addition, the amalgamated display control module 406 may also instruct the emissive display driver module 402 to activate elements in the designated portion, thereby causing the emissive display to render the video clip.

In an alternative implementation, a single driver module may be used to control both display types. For example, a single driver module may alternatively drive elements of the reflective display and elements of the emissive display. Conversely, the single driver module may simultaneously drive elements of the reflective display and elements of the emissive display.

Coplanar and Stacked Alternating Arrangement

Figure 5A:
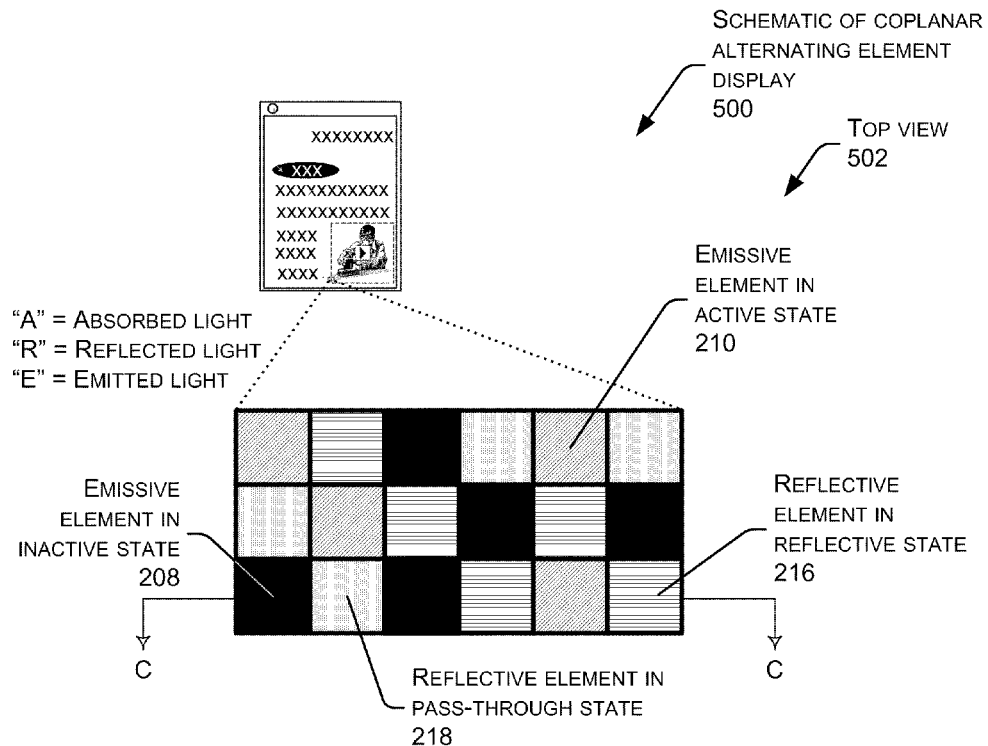
FIGS. 5A and 5B are schematics illustrating an example amalgamated display comprising reflective display elements interspersed with emissive display elements in substantially the same plane.
Figure 5B:
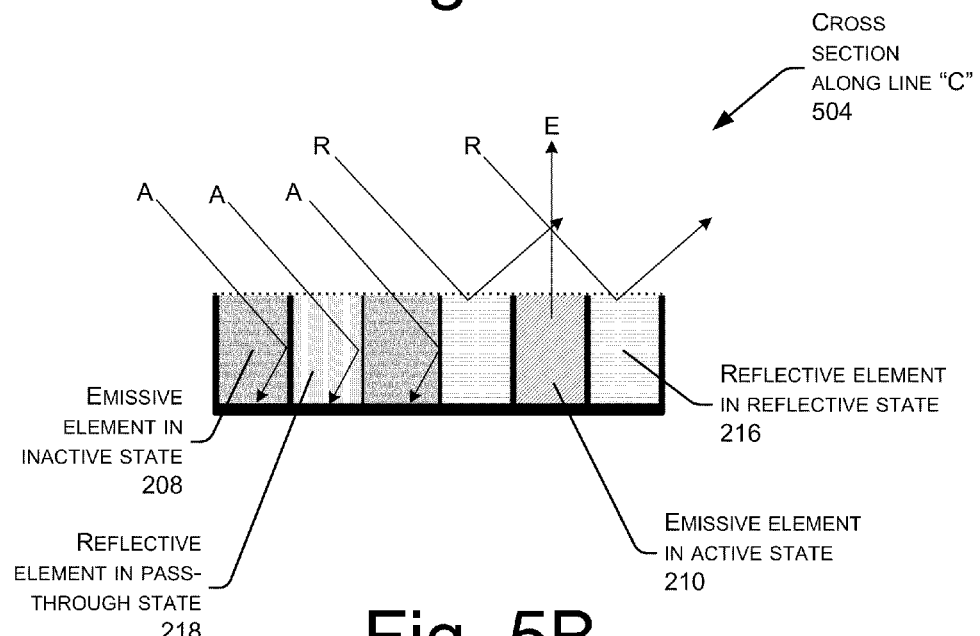

In contrast to the stacked collinear arrangement of the reflective and emissive display elements shown in FIGS. 2-3, reflective and emissive display elements may be placed in substantially the same plane in some instances. FIGS. 5A and 5B are schematics 500 illustrating an example amalgamated display comprising reflective display elements interspersed with emissive display elements in such an arrangement.

FIG. 5A is a top view 502 showing a checkerboard arrangement of display elements, where emissive elements and reflective elements alternate. A cross section along line "C" at 504 shown in FIG. 5B shows the arrangement where the emissive elements and the reflective elements reside substantially in the same plane. For simplicity and not by way of limitation, FIGS. 5A and 5B depicts reflective display elements and emissive display elements as having approximately the same dimensions. In other implementations, however, these display elements may vary in size. For example, reflective elements may be narrower, taller, wider, and so forth than emissive elements. Furthermore, in this implementation both reflective and emissive display elements may be active simultaneously, allowing mutual rendering by both reflective and emissive displays.

Figure 6A:
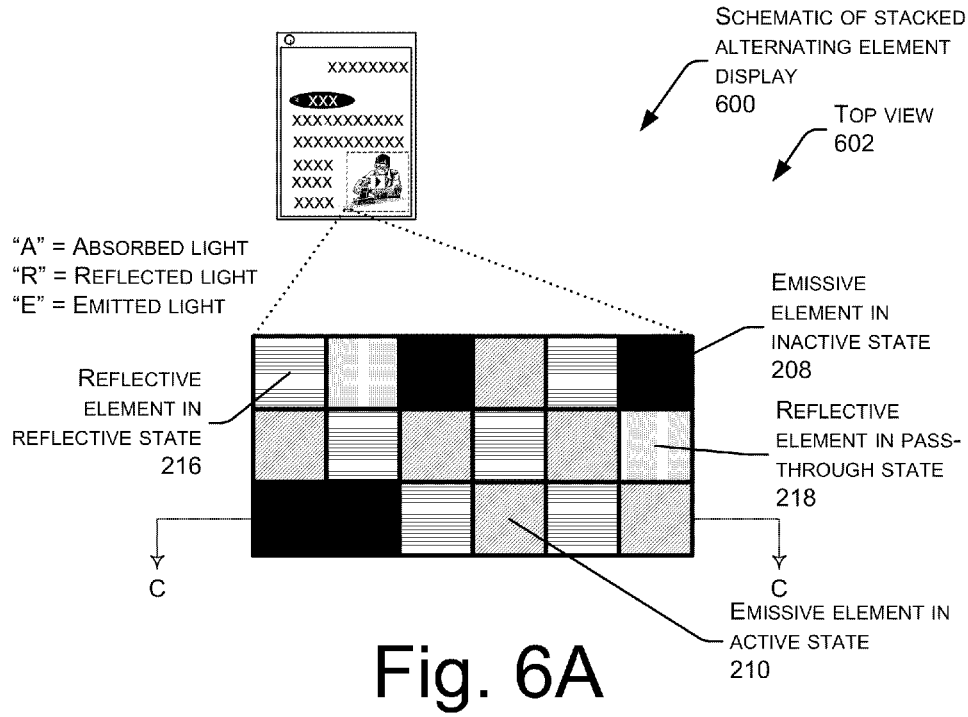
FIGS. 6A and 6B are schematics illustrating an example amalgamated display comprising reflective display elements in one plane interspersed with emissive display elements in another plane.
Figure 6B:
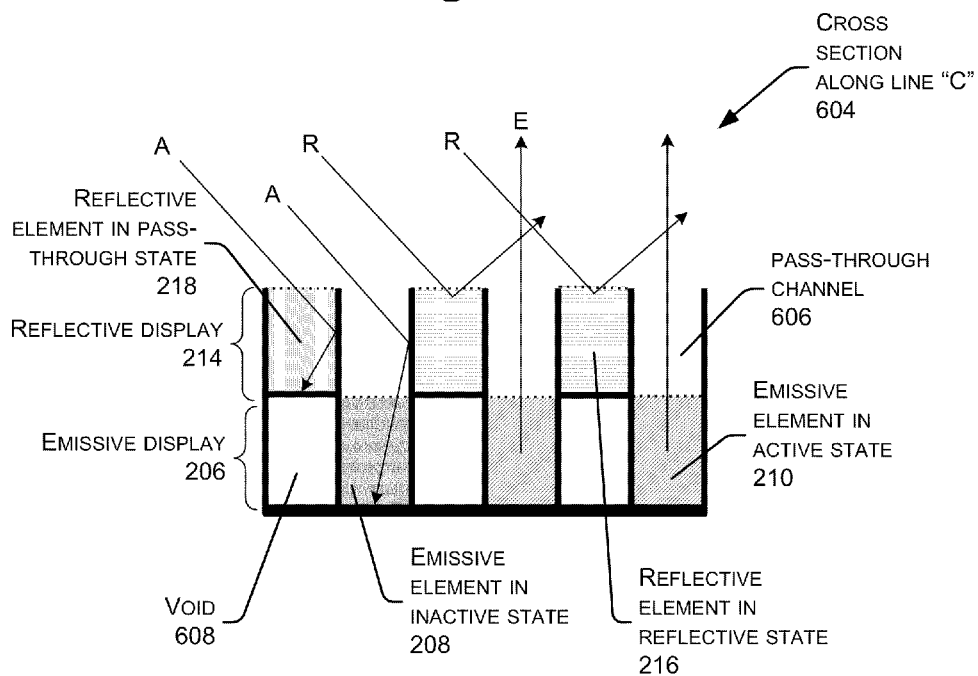

FIGS. 6A and 6B are schematics 600 illustrating an example amalgamated display comprising reflective display elements in one plane interspersed with emissive display elements in another plane. FIG. 6A shows a top view 602 of the pixels in a similar checkerboard arrangement as described above with respect to FIG. 5A. However, FIG. 6B shows a cross sectional view 604 along line "C," which illustrates how the stacked two-layer design is arranged with dissimilar elements offset to provide each display element with an unobscured path upwards and towards as the likely position of the viewer 112 when the viewer consumes the rendered content. In this example, the reflective display 214 resides in a plane above the plane in which the emissive display 206 resides. Thus, light emitted ("E") from the lower emissive display 206 does not pass through the reflective display 214 element, but rather through a pass-through channel 606 in this implementation. Similarly, underneath each reflective display element may be a void 608 or other structure.

As described previously, placement of a reflective display or emissive on the upper-most layer may be determined by performance and operational considerations. For example, the lower layer may exhibit a narrower field of view or receive less incident light than compared to the upper layer, given obscuration of the upper layer to the lower. Thus, in the application of an e-book reader where the primary application is displaying textual data, the reflective display may reside on the upper layer, as depicted here. In the example of a portable media player, meanwhile, where the primary application may be rendering video or color images, the emissive display may reside on the upper layer.

Amalgamated Display using EPD and OLED

Figure 7A:
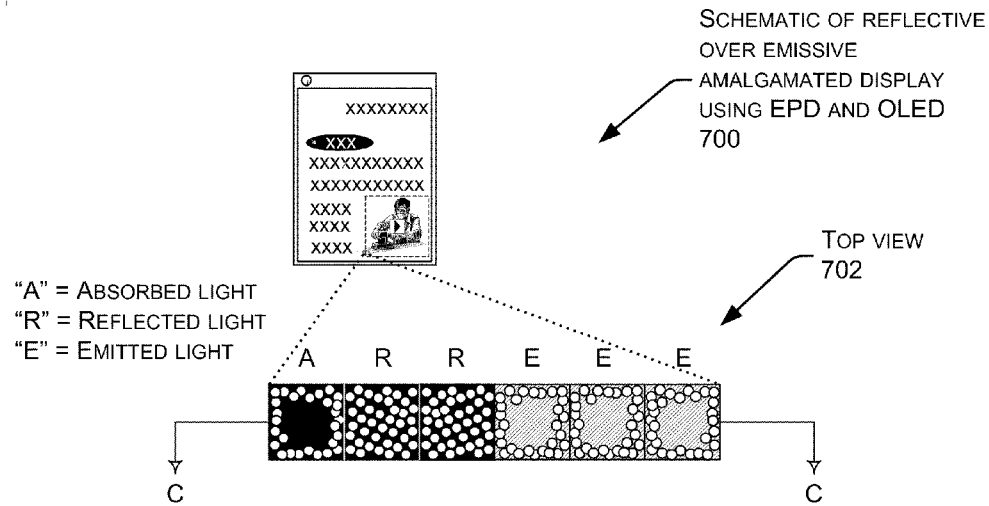
FIGS. 7A and 7B are schematics illustrating an example amalgamated display comprising a reflective electrophoretic (EPD) display over an emissive organic light emitting diode (OLED) display.
Figure 7B:
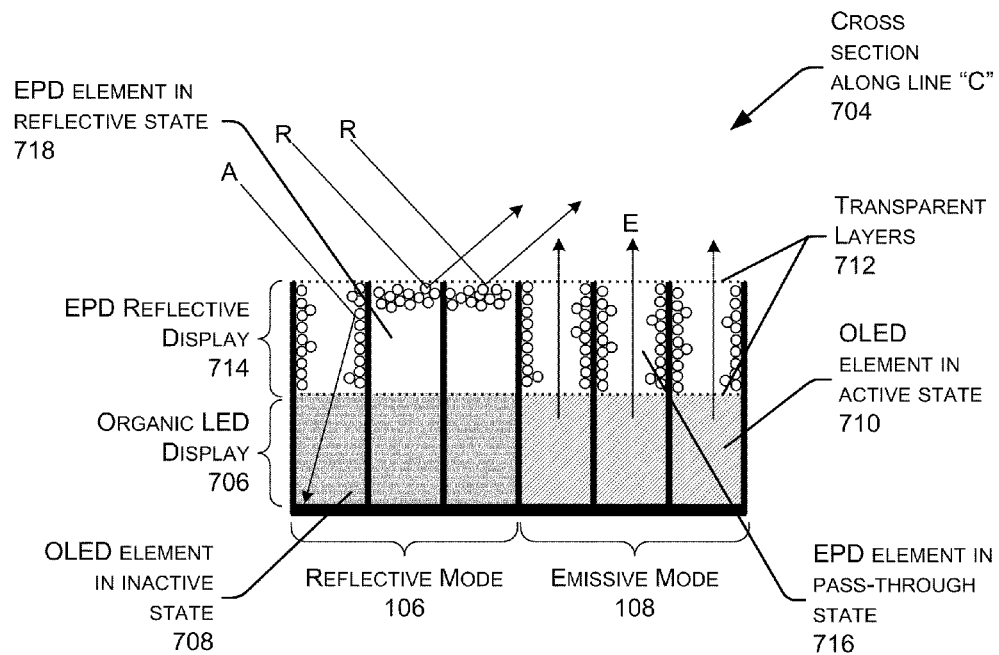

FIGS. 7A and 7B are schematics 700 illustrating an amalgamated display comprising a reflective electrophoretic (EPD) display over an emissive display, here illustrated as an organic light emitting diode (OLED) display. EPDs use electric charges to move small particles around to form light and dark spots. An OLED display transforms electricity into light. While FIGS. 7A and 7B illustrate an EPD display and an OLED display, other implementations may employ any other type of reflective and emissive displays.

In this implementation, the EPD uses white particles that may be manipulated using electric charges. In other implementations, the particles may be other colors or combinations of colors. As shown in the top view 702, particles have been arranged around the periphery of each element to permit incident light to enter and be absorbed "A" and to allow emitted light "E" to escape. In some EPD implementations, the arrangement of particles may be initiated using a voltage within the elements which in turn interacts with a charge on the particles.

In other EPD implementations, particles may be arranged on a single wall, two walls, three walls, a reservoir, and so forth, such that they provide a substantially un-obscured path. When the EPD element is in a reflective state, the particles cluster towards the top of the element reflecting incident light "R" to generate a white (non-dark) or lighter-appearing pixel to the viewer 112.

A cross section 704 along line "C" provides a side view of the particles clustering around the walls of each element to provide a pass-through either for emitted light or to allow incident light to be absorbed and create a dark pixel. An OLED display 706 contains inactive state elements 708 which are not emitting light, and elements in an active state 710 which are emitting light. The transparent layers 712 allow this emitted light "E" to pass from through the dissimilar displays towards the viewer 112. An EPD reflective display 714 is above the OLED display 706.

FIGS. 7A and 7B illustrate elements operating in the reflective mode 106 as well as elements operating in the emissive mode 108. For example, in the reflective mode 106, to generate a dark pixel the OLED display element is left in the inactive ("dark") state 708 while an EPD reflective display element above is set to pass-through state 716. Thus, incident light "A" passes through the reflective display element and is absorbed. This non-reflection appears to the viewer 112 as a dark pixel. To generate a white or non-dark pixel in the reflective mode 106, an EPD reflective display element may be set to a reflective state 718, bouncing incident light towards the eye of viewer 112. To accomplish a reflective state 718, particles in an EPD reflective display element may be configured to maximize reflection by arranging light colored particles into a layer at the top of the display element, as shown here.

Where the emissive mode 108 is in use, the EPD elements above the active OLED elements 710 are configured to maintain the pass-through state 716, to allow the emitted light to escape towards the viewer 112.

In another implementation, the OLED display 706 may be used to backlight at least a portion of the EPD 714. In this case, an EPD element that is in a reflective state 718 may also use an underlying OLED element (also in an active state) to produce an overall "lighter" or higher luminosity value for the pixel. While described in the context of OLED's and EPD's, these backlighting techniques may also be used for an array of other emissive and reflective display types.

Figure 8A:
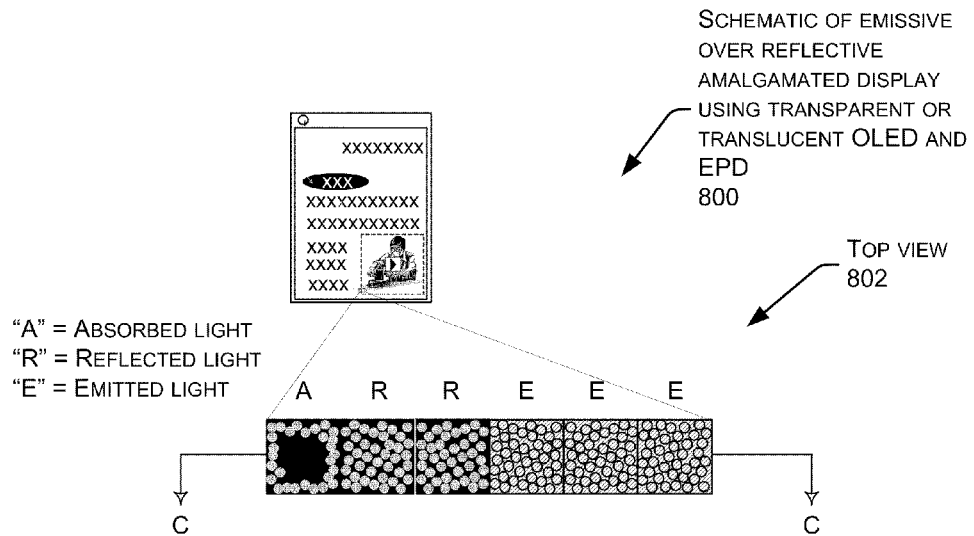
FIGS. 8A and 8B are schematics illustrating an example amalgamated display comprising a transparent emissive organic light emitting diode (OLED) display over a reflective electrophoretic (EPD) display.
Figure 8B:
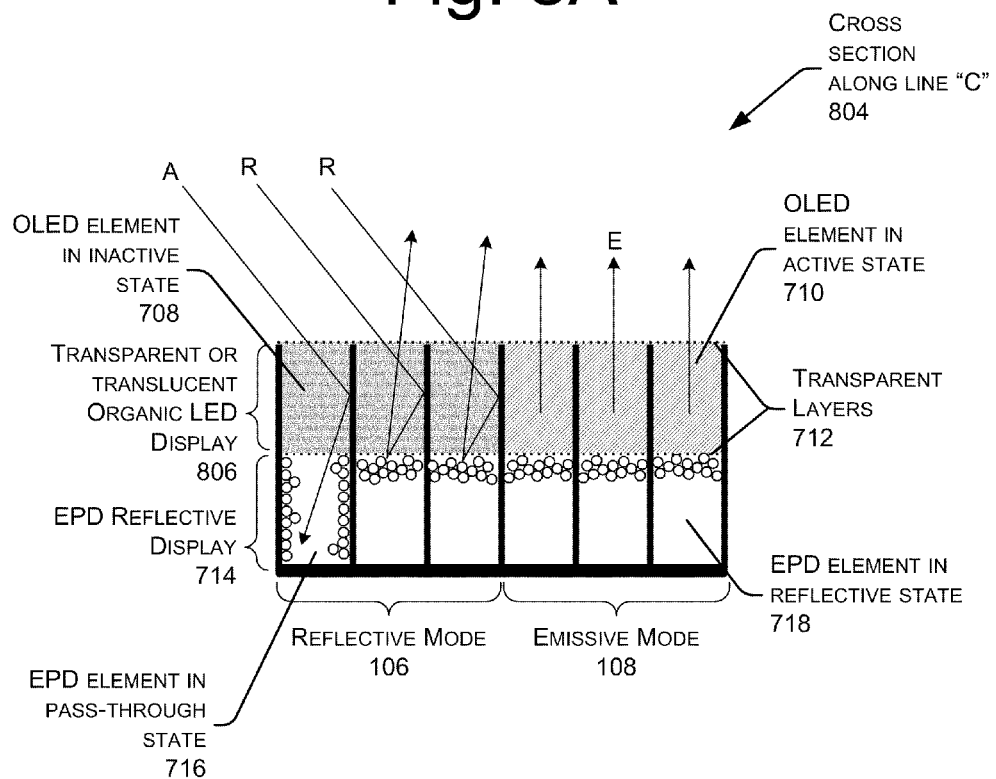

FIGS. 8A and 8B are schematics 800 illustrating an amalgamated display comprising a transparent emissive organic light emitting diode (OLED) display over a reflective electrophoretic (EPD) display. FIG. 8A shows a top view 802 illustrating an arrangement of the EPD particles in the display elements. FIG. 8B depicts a cross section 804 along line "C" showing how, in this implementation, the emissive OLED 706 is placed above the EPD reflective display 714, such as you might find in a device optimized for video playback. OLED 706 in this implementation is transparent or translucent, to allow incident light to reach the elements of the EPD reflective display 714. In some implementations, EPD reflective display elements behind an active OLED element 710 may be configured to reflect light to increase emission efficiency.

Process of Operation

Figure 9:
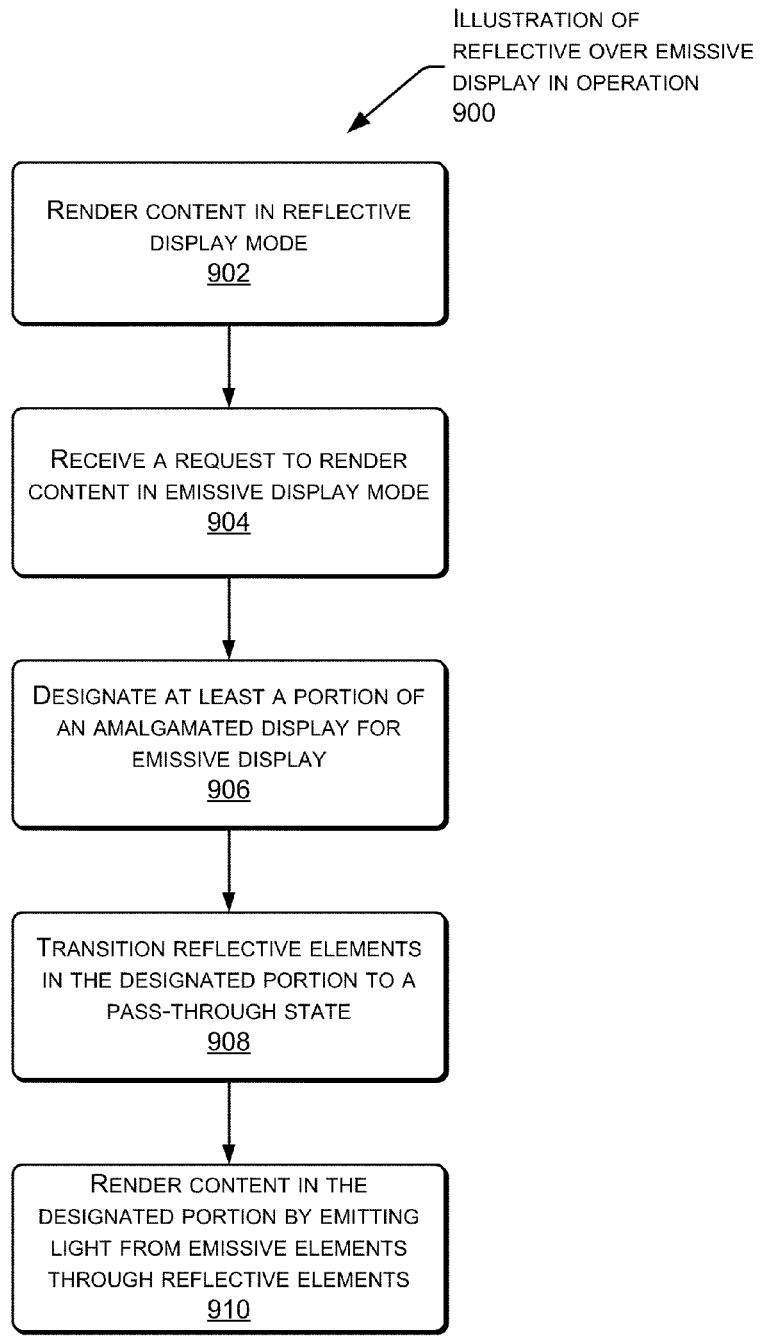
FIG. 9 is a flow diagram of an illustrative process of a reflective over emissive amalgamated display in operation.

FIG. 9 is a flow diagram of an illustrative process of a reflective over emissive amalgamated display in operation, that may, but need not, be implemented using the architecture shown in FIGS. 1, 2A, 2B, 4, 7A, and 7B. The process 900 is illustrated as a collection of blocks in a logical flow graph, which represent a sequence of operations that can be implemented in hardware, software, or a combination thereof. In the context of software, the blocks represent computer-executable instructions that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the process. For discussion purposes, the process will be described in the context of the architecture of FIGS. 1, 2A, 2B, 4, 7A, and 7B.

At 902, an amalgamated display that operates in reflective display mode renders content via light that reflects from reflective display elements of the reflective display. For example, the viewer 112 may be reading text of an e-book on device 102. A reflective display driver module (e.g., module 404) may control the reflective display elements.

At 904, the amalgamated display control module 406 receives a request to render content in an emissive display mode. For example, the e-book may contain a video clip which may be played back to the viewer. The emissive display may be selected, in some instances, because the video clip comprises full-motion video that is too fast for the reflective display to effectively reproduce.

At 906, the amalgamated display control module 406 designates a portion of the amalgamated display for emissive display. For example, the area indicated by the broken lines of FIG. 1 surrounding the image that represents the video clip. This designation may be made by amalgamated display control module 406.

At 908, emissive display driver module transitions reflective elements in the designed portion of the amalgamated display to a pass-through state to allow light emitted from the emissive display to reach the viewer 112. This transitioning may be at the direction of the reflective display driver module 404 under the control of the amalgamated display control module 406.

At 910, content is rendered in the designated portion by emitting light from active emissive elements under the control of the emissive display driver module 402. The emitted light passes through the reflective display elements to the eye of the viewer 112. In this example, the viewer 112 sees the video clip rendered by the emissive display, through the reflective display.

Conclusion

Although the subject matter has been described in language specific to structural features and/or methodological acts, it is to be understood that the subject matter defined in the appended claims is not necessarily limited to the specific features, dimensions, or acts described. Rather, the specific features, dimensions, and acts are disclosed as illustrative forms of implementing the claims. Moreover, any of the features of any of the devices described herein may be implemented in a variety of materials or similar configurations.

As described in this application, modules and engines may be implemented using software, hardware, firmware, or a combination of these. Moreover, the acts and methods described may be implemented by a computer, processor or other computing device based on instructions stored on memory, the memory comprising one or more computer-readable storage media (CRSM).

The CRSM may be any available physical media accessible by a computing device to implement the instructions stored thereon. CRSM may include, but is not limited to, random access memory (RAM), read-only memory (ROM), electrically erasable programmable read-only memory (EEPROM), flash memory or other solid-state memory technology, compact disk read-only memory (CD-ROM), digital versatile disks (DVD) or other optical disk storage, magnetic cassettes, magnetic tape, magnetic disk storage or other magnetic storage devices, or any other medium which can be used to store the desired information and which can be accessed by a computing device.

What is claimed is:

1. An amalgamated display device comprising:
   an electrophoretic display (EPD) driven by a first control module and configured to render a first type of content as a first portion of an image and maintain a pass-through state for a second portion of the image;
   an emissive display driven by a second, different control module and positioned behind the EPD, wherein the emissive display is configured to emit light through the EPD in the pass-through state to render a second type of content as the second portion of the image; and
   wherein at least one of a size or a location of the first portion and the second portion is varied based, at least in part, on a type of content to be rendered.

2. The amalgamated display device of claim 1, wherein the first type of content comprises text and the second type of content comprises a color image or a video.

3. The amalgamated display device of claim 1, wherein the EPD comprises monochromatic particles.

4. The amalgamated display device of claim 1, wherein the EPD is further configured to enter the pass-through state by arranging particles to at least one side of an element of the EPD.

5. The amalgamated display device of claim 1, wherein the emissive display comprises elements configured to generate different colors of light.

6. A device comprising:
   an amalgamated display comprising a reflective display configured to render a first type of content on the amalgamated display and an emissive display residing on top of the reflective display and configured to render a second type of content on the amalgamated display, wherein at least a portion of the reflective display is viewable through the emissive display; and
   a control module configured to drive both the reflective display and the emissive display to render the respective content on the amalgamated display.

7. The device of claim 6, wherein at least a portion of the emissive display is transparent or translucent to enable at least the portion of the reflective display to be viewable through the emissive display.

8. A device comprising:
   an amalgamated display comprising a reflective display and an emissive display stacked atop one another, wherein:
   the reflective display is configured to render content on a first portion of the amalgamated display and the emissive display is configured to render content on a second portion of the amalgamated display; and
   elements used to generate the pixels of the reflective display are approximately a same size as elements used to generate the pixels of the emissive display.

9. The device of claim 8, wherein the amalgamated display is configured to render content with at least one of a plurality of the reflective display elements of the reflective display or a plurality of the emissive display elements of the emissive display.

10. The device of claim 8, wherein the emissive display produces a pixel using emitted photons.

11. The device of claim 8, wherein the reflective display produces a pixel using incident photons.

12. The device of claim 8, wherein the emissive display emits light through the reflective display when rendering content on the amalgamated display.

13. The device of claim 8, wherein the reflective display reflects light through the emissive display when rendering content on the amalgamated display.

14. The device of claim 8, wherein the reflective display comprises an electrophoretic display (EPD), a cholesteric liquid crystal display, a microelectromechanical system (MEMS) display, an electrowetting display, or an electrofluidic display.

15. The device of claim 8, wherein the reflective display elements of the reflective display are configured to be substantially transparent or translucent to light when in a pass-through state.

16. The device of claim 15, wherein the emissive display renders the content by emitting light through the reflective display elements of the reflective display that are in the pass-through state.

17. The device of claim 8, wherein the emissive display elements of the emissive display are configured to be substantially transparent or translucent to light when in an inactive state.

18. The device of claim 17, wherein the reflective display renders the content by receiving incident light through the emissive display elements of the emissive display that are substantially transparent or translucent in the inactive state and reflecting or absorbing the received incident light.

19. The device of claim 8, wherein the emissive display comprises a light emitting diode (LED) display, an organic LED (OLED) display, a backlit liquid crystal display (LCD), a plasma display, a microelectromechanical system (MEMS) display, an electroluminescent display, a quantum dot display, or a field emission display.

20. The device of claim 8, wherein the reflective display elements of the reflective display and the emissive display elements of the emissive display are arranged in an alternating checkerboard fashion.

21. The device of claim 8, wherein the reflective display elements of the reflective display and the emissive display elements of the emissive display are substantially coplanar with one another.

22. The device of claim 8, wherein the amalgamated display comprises at least one display in addition to the reflective display and the emissive display.

23. The device of claim 8, wherein the first and second portion appear as a single image when rendered on the amalgamated display.

24. One or more non-transitory computer-readable storage media storing instructions that, when executed by a processor, cause the processor to perform acts comprising:
designating at least a first portion of an amalgamated display to enter an emissive display mode provided by an emissive display of the amalgamated display to render a first type of content on the first portion;
designating at least a second portion of the amalgamated display to enter a reflective display mode provided by a reflective display of the amalgamated display to render a second type of content on the second portion; and
varying at least one of a size or a location of the first portion and the second portion based at least in part on a type of content to be rendered.

25. The one or more non-transitory computer-readable media of claim 24, further storing computer-executable instructions that, when executed by the processor, cause the processor to perform an act comprising configuring the reflective display to pass light emitted from an emissive element of the emissive display.

26. One or more non-transitory computer-readable storage media storing instructions that, when executed by a processor, cause the processor to perform acts comprising:
rendering a first piece of content on an amalgamated display device comprising an emissive display and a reflective display with use of the emissive display;
contemporaneously rendering a second piece of content on the amalgamated display device with use of the reflective display; and
varying at least one of a size or a location of the first portion and the second portion based at least in part on a type of content to be rendered.

27. The one or more non-transitory computer-readable media of claim 26, wherein the first piece of content comprises a color image or a video and the second piece of content comprises a portion of text.

28. The one or more non-transitory computer-readable media of claim 26, wherein the reflective display resides on top of the emissive display in the amalgamated display device, and wherein the rendering of the first piece of content with use of the emissive display comprises:
causing at least a portion of the reflective display to enter a pass-through state; and
emitting light from the emissive display through the portion of the reflective display in the pass-through state to render the first piece of content.

29. The one or more non-transitory computer-readable media of claim 28, wherein the reflective display comprises an electrophoretic display (EPD) that renders the second piece of content by moving particles within respective reflective display elements of the EPD, and wherein the causing of the portion of the reflective display to enter the pass-through state comprises moving particles within each respective element within the portion to one or more sides of the element.

* * * * *